United States Patent [19]
Aghazadeh et al.

[11] Patent Number: 5,289,337
[45] Date of Patent: Feb. 22, 1994

[54] HEATSPREADER FOR CAVITY DOWN MULTI-CHIP MODULE WITH FLIP CHIP

[75] Inventors: Mostafa Aghazadeh, Chandler; Mark Palmer, Phoenix, both of Ariz.

[73] Assignee: Intel Corporation, Santa Clara, Calif.

[21] Appl. No.: 839,859

[22] Filed: Feb. 21, 1992

[51] Int. Cl.$^5$ ............................................. H05K 7/20
[52] U.S. Cl. .................. 361/718; 165/80.3; 361/764; 257/712
[58] Field of Search ............... 165/80.3, 185; 174/16.3; 357/81; 361/382, 383, 386–389, 401

[56] References Cited

U.S. PATENT DOCUMENTS

| | | | |
|---|---|---|---|
| 4,442,450 | 4/1984 | Lipschutz | 357/81 |
| 4,605,986 | 8/1986 | Bentz | 361/386 |
| 4,890,194 | 12/1989 | Derryberry | 361/386 |
| 4,941,067 | 7/1990 | Craft | 361/386 |
| 5,107,330 | 4/1992 | Dahringer | 357/81 |

OTHER PUBLICATIONS

"Circuit Chip . . . Bond", Coombs et al., IBM Tech Discl. Bull. vol. 21, No. 1, Jun. 1978, pp. 99, 100.

*Primary Examiner*—Gerald P. Tolin
*Attorney, Agent, or Firm*—Blakely, Sokoloff, Taylor & Zafman

[57] ABSTRACT

A converging design multi-chip module having semiconductor chips connected to a substrate recessed into a cavity of the MCM package body, the chips being interconnected using flip chip and control collapse chip connection, wherein a metal heatspreader plate is adapted to engage the backside of the chips and is held in place by an attachment ring welded to the package body. Alternatively, the heatspreader plate can be glued directly to the backside of the chips using a high thermal conductivity and low modulus cement. One or more electrically passive thermal shunt chips are disposed between the substrate and the heatspreader plate for additional heat conduction. In a preferred embodiment, the attachment ring is made from KOVAR ® and has a thermal coefficient of expansion that is about the same as that of the package body. Thermal grease is interposed between the heatspreader plate and the semiconductor chips for improved heat transfer. In an alternative embodiment, the heatspreader plate is directly shunted to the substrate. In another alternative embodiment, the heatspreader plate is urged against the chips by a spring plate or a coiled spring against a lid for the package cavity.

9 Claims, 3 Drawing Sheets

HEAT FLOW DIRECTION
ELECTRICAL SIGNAL DIRECTION

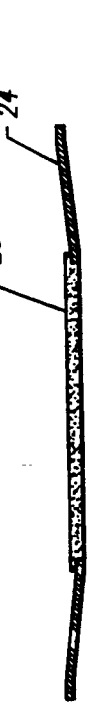
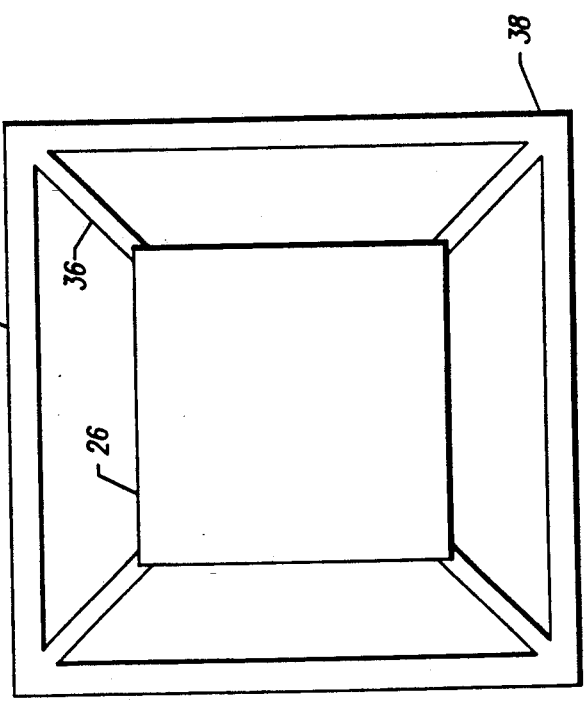
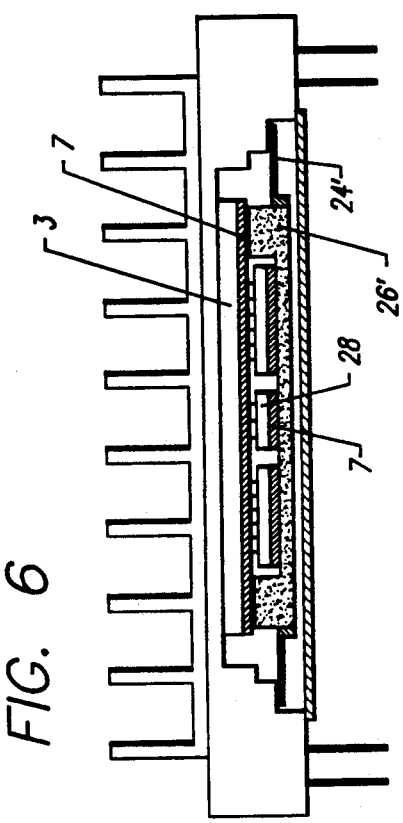
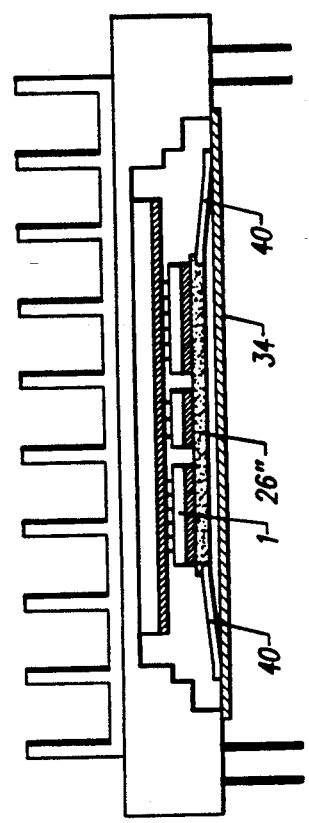
FIG. 5(a)
FIG. 5(b)
FIG. 6
FIG. 7

HEATSPREADER FOR CAVITY DOWN MULTI-CHIP MODULE WITH FLIP CHIP

BACKGROUND OF THE INVENTION

1. Field of the Invention

The present invention relates to cooling of a multi-chip module. More precisely, the present invention relates to reducing the thermal resistance of a multi-chip module (i.e., "MCM") that uses flip chip and control collapse chip connection as the interconnect to the substrate in a cavity down ceramic package by adapting a heatspreader plate and a thermal shunt chip to the module.

2. Prior Art and Related Information

In conventional multi-chip modules, by packing a number of semiconductor devices in close proximity to each other while eliminating the individual packages for each of the devices, the electrical performance is improved and the board space occupied by the devices is reduced. Due to an increase in the packing density, however, the power density of the multi-chip module is typically higher than when separately packaged devices requiring more elaborate thermal design and thermal management schemes in order to maintain the device temperature within acceptable ranges are used.

In conventional multi-chip modules, the devices are connected to a substrate and the electrical connection among the devices is accomplished within the substrate, which may also be an integral part of the MCM package. One of the technologies used to connect the devices to the substrate is called flip chip and control collapse chip connection (i.e., "C4"). With this technology, solder bumps are developed at the chip terminals. Subsequently, the devices are flipped over on the substrate and the solder bumps are reflowed to make connection to the terminal pads on the substrate as shown in FIGS. 1(a) and 1(b). Internal thermal resistance and thermal performance of the MCM using flip chip and C4 interconnect technology are determined by the heat flow paths from the devices to the package body. Most of the heat generated by the devices flows out through one of the two primary heat flow paths in order to get to the package surface and eventually to a heat sink located on the package surface.

Based on the heat flow paths from the devices to the package body, the thermal design of modules with flip chip and C4 is categorized as a diverging design or a converging design. In a diverging design, the module may be arranged so that most of the heat flows out from the back side (passive side of the semiconductor device) as shown in FIG. 2(b). This arrangement is called a diverging MCM design because heat flows out of the device 1 in the opposite direction relative to the direction of the electrical signal flow, as indicated by the arrows in the magnified view of FIG. 2(a). More precisely, heat flows from the backside 8 of the device 1 through a thermally conductive medium 7 to the package body 4 and the heat sink 6 while the electrical signals flow out from the active side 9 of the device 1 to the substrate 3 and the interconnect layers within the substrate 3. Typically, the thermally conductive medium 7 is thermal grease or solder. A lid 5 encloses the devices 1 inside the package body 4.

In the case of a converging design, shown in FIGS. 3(a) and (b), the heat flows out from the active side 9' of the device 1', which is the same side as the circuitry. Hence, the electrical signals also flow out in the same direction as the heat flows. As indicated by the arrows in the magnified view of FIG. 3(a), the heat flows through the C4 solder bumps 2' into the substrate 3', from the substrate 3' to the package body 4', and eventually to the heat sink 6'. A lid 5' encloses the devices 1' inside the package body 4'.

Unfortunately, the conventional converging and diverging MCM designs have shortcomings. For example, the thermal performance of the converging multi-chip module with flip chip and C4 depends on thermal resistance through the solder bumps as well as the substrate's thermal characteristics. The thermal resistance from each device to the substrate is thus a function of the number and size of the bumps, and the thermal resistance of the substrate. But the number of the solder bumps is constrained by the number of electrical pads on the device as well as by the size of the available area on the die for placing electrically passive bumps (i.e., thermal bumps). Consequently, heat dissipation is limited by the area available for conduction.

Although the thermal resistance of the substrate can be decreased by incorporating thermal vias in the substrate, doing so increases the cost of the substrate and limits the routing capability of the substrate. Since heat management is a constant factor in circuit design, a need presently exists for effectively and efficiently cooling MCMs.

SUMMARY OF THE INVENTION

The present invention is directed to reducing the thermal resistance of multi-chip modules (MCM) which use flip chip and control collapse chip connection (C4) as the interconnect to the substrate in cavity down ceramic packages; the consequence is, of course, lowering the device temperature.

In a preferred embodiment, the present invention provides a multi-chip module prepared by the above-mentioned flip chip and control collapse chip connection process. The top of the MCM package body includes a heat sink for large scale heat dissipation. Underneath the package body is a cavity in which the substrate and associated devices are installed. For cooling purposes, the present invention provides a heatspreader plate that is adapted to engage the non-active side of the dice. A layer of thermal grease spread between each chip or die and the heatspreader plate acts as a heat conductor thereby improving heat transfer. As mentioned above, this particular arrangement of the dice on the substrate relative to the package is commonly known as a converging MCM design.

To enhance heat dissipation, the present invention provides a heatspreader plate disposed on the backside of the dice. Heat generated in the dice transfer, primarily through conduction, to the heatspreader plate An attachment ring, which appears somewhat like a web, surrounds the heatspreader plate at its perimeter. Inwardly stretching legs of the attachment ring secure it to the heatspreader plate. At the corners of the polygonal shape attachment ring are peripheral portions which are welded to the package body near the perimeter of the cavity. Thus, the attachment ring supports the heatspreader plate, holding it snug against the dice. Thermal grease is interposed between the dice and the heatspreader plate for better heat conduction.

In operation, the present invention provides two thermal paths through which heat is dissipated. First, heat generated in the dice passes into the substrate and continues up through the package body, eventually dissipating inside the heat sink. Second, with the addition of the heatspreader, the heat dissipated by higher power devices is conducted through the heatspreader via the thermal grease. Once at the heatspreader, the heat spreads by conduction within the heat spreader and is conducted into the lower power devices via the thermal grease and into the substrate and subsequently dissipating inside the heat sink. Of course the legs transfer the heat into the package housing, too.

The attachment ring is made from a material that has a thermal coefficient of expansion that is compatible with the package body. This compensates for temperature induced dimensional variations in the package body, which variations must be accommodated by the outstretched legs.

The present invention also enhances heat transfer from the substrate by employing one or more passive thermal shunt chips. These passive thermal shunt chips are electrically inert, but are nevertheless disposed on the substrate similar to active devices. Their primary purpose is to conduct heat away from the heatspreader, and in a preferred embodiment, to transfer the heat to the substrate reducing the temperature of the heatspreader and as a result reducing the temperature of the active devices.

The present invention provides improvements over the prior art. For instance, increased thermal performance is a critical component of competitive MCM technology; but the conventional approach introduces serious limitations which are ultimately reflected in the excessive size of cooling heat fins needed or the magnitude of the cooling air flow rate, or both. Also, the conventional divergent MCM approach has only been accomplished with very complex and expensive designs. The present invention, however, improves the thermal performance of multi-chip modules which use flip chip and C4 technology as the interconnect and relies on the heat flow through the solder bumps for cooling the devices. In particular, by incorporating the heatspreader plate into the cooling hardware, the temperature of the hottest device in the present invention module is lower than the temperature of the hottest device in a prior art module. Lower device temperature increases the module reliability and enhances its electrical performance. As a result, the present invention provides efficient thermal enhancement of MCMs in a cost effective manner.

In addition, since in the present invention the effective thermal resistance from the hottest device to the module package case is reduced by the use of the heatspreader plate, cost or performance advantages can be achieved elsewhere in the total package thermal design. An example of such a cost or performance advantage is in the use of a smaller and lower performance heat sink, which can be used for maintaining the same maximum device temperature as in comparable prior art modules. Using a lower performance heat sink consequently leads to savings in system cost and space.

Accordingly, it is an object of the present invention to provide a heatspreader plate in a converging design flip chip/C4 multi-chip module. It is another object of the present invention to use passive thermal shunt silicon chips for providing additional heat flow path into the substrate and consequently lowering the temperature of high power density devices. It is yet another object of the present invention to provide a heatspreader plate design with direct contact area to the substrate. It is still another object of the present invention to adapt the heatspreader plate to the package by use of an attachment ring.

BRIEF DESCRIPTION OF THE DRAWINGS

FIGS. 5(a) and 5(b) are side and plan views, respectively, of the heatspreader plate connected to an attachment ring.

FIG. 6 is a side view of an alternative embodiment of the present invention wherein the heatspreader plate directly shunts heat from the substrate.

FIG. 7 illustrates another alternative embodiment of the present invention wherein a spring plate abutting the package lid biases a heatspreader plate against the backside of the devices.

DETAILED DESCRIPTION OF THE INVENTION

In the following description, numerous details such as specific materials and configurations are set forth in order to provide a more complete understanding of the present invention. But it is understood by those skilled in the art that the present invention can be practiced without those specific details. In other instances, well-known elements are not described explicitly so as not to obscure the present invention.

The present invention relates to an apparatus for cooling multi-chip modules or MCMs. In a preferred embodiment, the present invention adapts a heatspreader plate and passive thermal shunt chips to a converging design MCM using flip chip and control collapse chip connection interconnect technology.

Figure 2A:
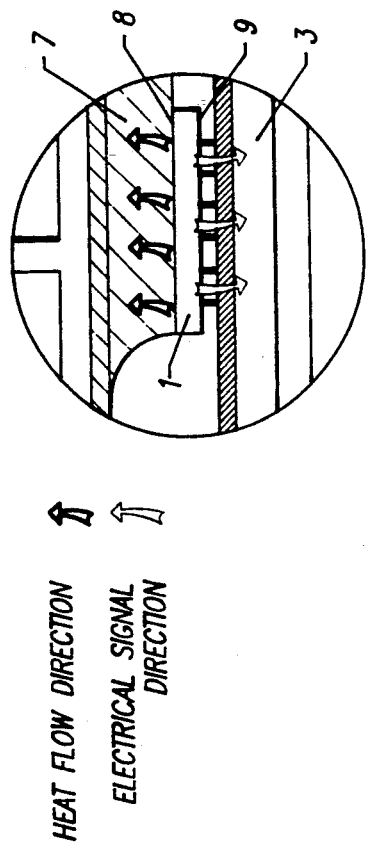
FIGS. 2(a) and 2(b) are magnified and cut-away side views, respectively, of a prior art diverging MCM design.
Figure 2B:
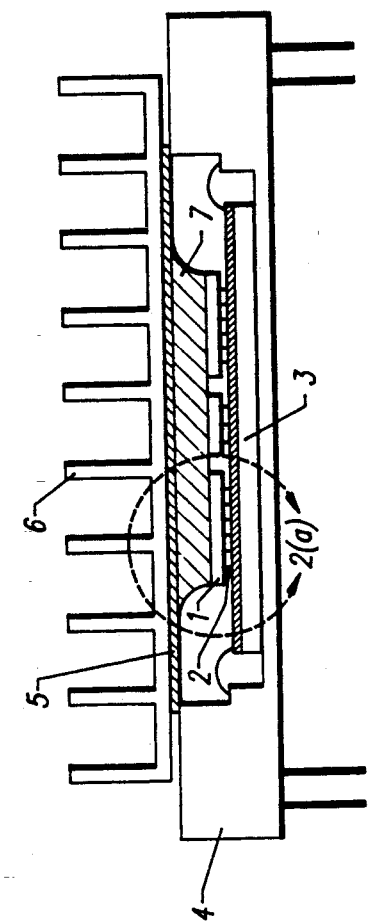
Figure 1A:
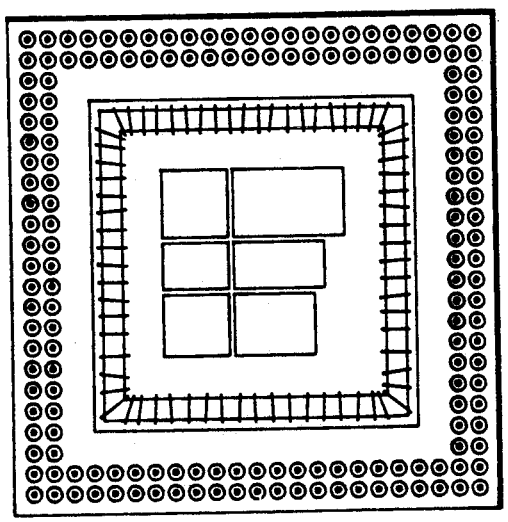
FIGS. 1(a) and 1(b) are plan and cut-away side views, respectively, of a prior art multi-chip module.
Figure 1B:
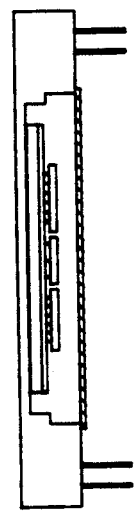
Figure 4:
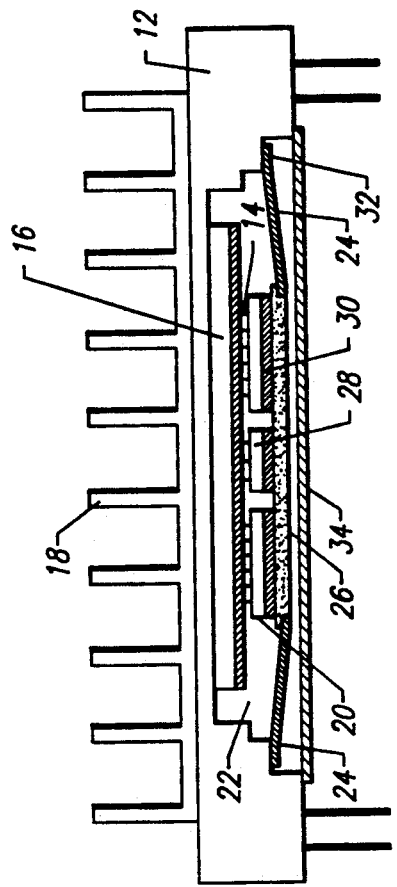
FIG. 4 is a cut-away side view of the present invention converging MCM with a heatspreader plate and thermal shunt chips installed.
Figure 3A:
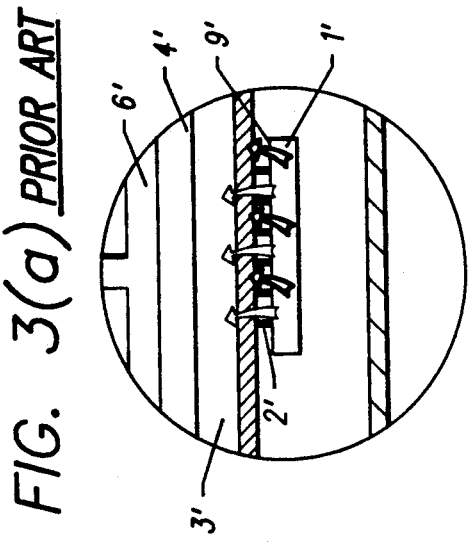
FIGS. 3(a) and 3(b) are magnified and cut-away side views, respectively, of a prior art converging MCM design.
Figure 3B:
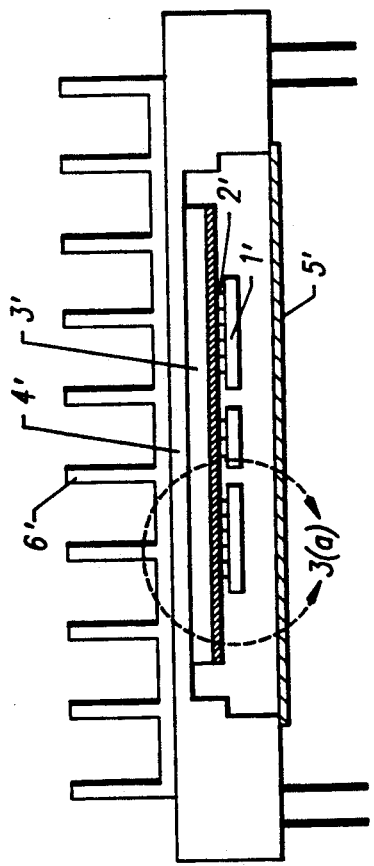

FIG. 4 illustrates the present invention in a cut-away side view. As seen in the drawing, the present invention in a preferred embodiment provides an MCM package body 12 having a cavity 22 recessed therein. A heat sink 18 is disposed on a side of the package body 12 for dissipating heat. Inside the cavity 22 is a silicon substrate 16 that carries a network of semiconductor chips 20 electrically interconnected by using flip chip and control collapse chip connection, known in the art and discussed above.

The present invention provides a heatspreader plate 26 placed on the obverse or backside of the devices 28 as shown in FIG. 4. Preferably the heatspreader plate 26 made of a high thermal conductivity material such as aluminum, copper or the like, since a major function of the heatspreader plate 26 is dissipation of heat generated in the devices 28. Ideally, the heatspreader plate 26 has a flat, polygonal shape designed to overly the devices 28 and to give good contact once installed. Of course the shape of the heatspreader plate 26 can be varied according to substrate shape and layout of the devices.

A thin layer of thermal grease 30 is applied between the heatspreader plate 26 and the backside of the devices 28. The thermal grease 30 minimizes the contact thermal resistance between the heatspreader plate 26 and the devices 28. Specifically, the thermal grease 30 fills up the space between the heatspreader plate 26 and the devices 28, which space may have developed due to the variations in the device heights and warpage of the heatspreader plate 26 or the substrate 16. Naturally, other pliable, heat conducting material known in the art similar to thermal grease can be used in place thereof.

A suspension mechanism is necessary to hold the heatspreader plate 26 against the devices 28 for proper heat conduction. For that purpose the present invention provides a web-like attachment ring 24 which is suspended from the package body 16. FIGS. 5(a) and 5(b) are respective side and a plan views of the attachment ring 24 as it is joined to the heatspreader plate 26. The basic shape of the attachment ring 24 is preferably a polygon having as many sides as the heatspreader plate 26. Its shape is reminiscent of a web because of its open central area having inward-stretching legs 36 that are attached to the heatspreader plate 26, and its peripheral portion 38 that surrounds the perimeter of the plate 26. Other attachment ring configurations are, of course, possible. Also, any means of attachment known in the art is acceptable to join the inward stretched legs 36 of the attachment ring 24 to the heatspreader plate 26.

Preferably, the attachment ring 24 is made out of a material which has a thermal coefficient of expansion (TCE) that matches that of the material for the package body 12. For a typical ceramic packaging material such as alumina, the attachment ring 24 is preferably made out of KOVAR ®. KOVAR ®, as is known in the art, is a trademark for an iron-nickel-cobalt metal alloy. It has thermal expansion characteristics close to that of glass or typical ceramics. As shown in FIG. 4, the attachment ring 24 is welded to the package body 12 at KOVAR ® pads which are brazed to the package 12 beforehand by a process known in the art.

The foregoing cooling hardware are assembled to the package body 12 as follows. First, thermal grease 30 is screen printed on the heatspreader plate 26. Next, the heatspreader plate 26 is picked and placed on the backside of the devices 20. The attachment ring 24 is welded to the package body 12 at the KOVAR ® pads 32. Finally, a lid 34 encloses the devices 20 and associated cooling hardware inside the cavity 22.

By spreading the heat generated by high power density devices 20 to the lower power density devices, the heatspreader plate 26 reduces the temperature of the high power density devices 20 and increases the temperature of the low power density devices. As result, the heatspreader plate 26 reduces the maximum device junction temperature in the module.

To improve the thermal performance of the MCM even further, the present invention as shown in FIG. 4 relies on one or more passive thermal shunt chips 28 attached to the substrate 16 to serve as heat flow paths to the substrate 16. These chips 28 are electrically passive and their only role is to shunt the heat generated in the active devices 20 to the substrate 16. It is preferred that one or more of these electrically passive chips 28 be assembled to the substrate 16 at the same time that the active chips 20 are assembled thereto.

During operation, heat produced in the devices flows out primarily through two paths. First, a portion of the heat generated at the high power density device travels directly to the substrate 16 through the solder bumps, both thermal and electrical. Second, the remainder of the heat flows into the heatspreader plate 26 through the thin layer of the thermal grease 30 and spreads within the heatspreader plate 26. This second portion of the heat flows back into the substrate 16 through the thermal grease, lower power density devices, thermal shunt chips 28 and the solder bumps attached to these chips 28. By using the heatspreader plate 26, smaller amounts of heat flow into the substrate 16 directly from the high power density devices as compared to a conventional module design that lack a heatspreader plate. As a result, the temperature of the high power device is lower than the temperature of the same device in the same package without the heatspreader plate, as is known conventionally. Hence the heatspreader plate 26 more efficiently spreads the heat from the higher power density to the lower power density devices.

To be sure, the temperature of the devices with lower power densities is higher than in the prior art cooling apparatus since a portion of the heat generated by the high power density device passes through the lower power density devices and heats up the latter. Consequently, by using the heatspreader plate 26, the temperature of the hottest device in the present invention module is lower than the temperature of the hottest device in the same module design but without the heatspreader plate 26.

In an alternative embodiment shown in FIG. 6, in lieu of or in addition to using the passive thermal shunt chips 28, the heat can be shunted to the substrate by a specially configured heatspreader plate 26' which contacts the substrate 3 through a layer of thermal grease 7. With a shunted heatspreader plate 26' as described here, the thermal resistance between the heatspreader plate 26' and the substrate 3 is reduced significantly. To accommodate the slight change in physical outlay of the heatspreader plate 26', the attachment ring 24' needs to be modified at the point of attachment.

In another alternative embodiment, the heatspreader plate 26" can be pre-attached to the package lid or cap 34 with a biasing means 40 that urges the heatspreader plate 26" against the backside of the devices 1 as shown in FIG. 7. Any biasing means 40 known in the art is suitable. For example, a spring plate or pressure plate mounted to the heatspreader plate is acceptable, as is a coiled spring or the like. In this alternative embodiment, no attachment ring is needed. In yet another alternative embodiment (not shown), the heatspreader plate can be glued to the backside of the devices by using a high thermal conductivity and low modulus cement.

What is claimed is:

1. An integrated circuit module, comprising:
   a package body having a cavity;
   a substrate having a first side and an obverse side, wherein the obverse side is joined to the package body within said cavity;
   an active integrated circuit chip attached to the first side of the substrate;
   a heatspreader plate engaging the active integrated circuit chip; and
   a passive thermal shunt chip that performs no active circuit function having a connect side and an obverse side, the connect side of the passive thermal shunt chip being disposed on the substrate with the obverse side of the passive thermal shunt chip being disposed on the heatspreader plate.

2. The module according to claim 1, wherein the converging multi-chip module further comprises an attachment ring having peripheral portions and an open central area such that the heatspreader plate is disposed substantially centrally therein, the attachment ring having inward extending legs that attach to the heatspreader plate, and wherein the attachment ring is attached to the package body at the peripheral portions.

3. The module according to claim 2, wherein thermal grease is interposed between the heatspreader plate and the obverse side of the semiconductor chip.

4. The module according to claim 3, wherein the attachment ring is made from a metal alloy having a first thermal coefficient of expansion similar to a second thermal coefficient of expansion of the package body.

5. The module according to claim 4, wherein the package body further comprises pads made from KOVAR ® to which the attachment ring is welded.

6. The module according to claim 5, wherein the heatspreader plate is composed of a material selected from the group consisting of copper, aluminum, or silver.

7. The module according to claim 1, wherein the heatspreader plate engages the substrate whereby the heatspreader plate operates as a direct thermal shunt.

8. The module according to claim 1, wherein the heatspreader plate is glued to the obverse side of the active integrated circuit chip.

9. A converging multi-chip module employing control collapse chip connection that interconnects flip chip semiconductor chips, each chip having an electrical connect side and an obverse side, said converging multi-chip module comprising:
- a package body having a top side and an underside, wherein the underside includes a cavity;
- a heat sink disposed on the top side of the package body;
- a multi-chip module substrate having a first side and an obverse side, the substrate being attached on the first side to the underside of the package body inside the cavity and having chips disposed on the obverse side, wherein the electrical connect side of the chips engage the obverse side of the substrate;
- a thermal shunt chip having a top side and a bottom side, wherein the top side of the thermal shunt chip engages the the obverse side of the substrate;
- thermal grease covering the obverse side of the chips and the bottom side of the thermal shunt chip;
- a heatspreader plate having a substantially flat, polygonal shape, engaging the thermal grease;
- attachment pads disposed on the package body adjacent to a periphery of the cavity; and
- a polygonal shape attachment ring having a central opening with legs extending inward toward a center of the opening, wherein the heatspreader plate is disposed inside the central opening such that the legs are attached to the heatspreader plate, and wherein the attachment ring includes peripheral portions that join the attachment pads.

* * * * *